US011929735B2

(12) United States Patent
Yantchev et al.

(10) Patent No.: US 11,929,735 B2
(45) Date of Patent: *Mar. 12, 2024

(54) XBAR RESONATORS WITH NON-RECTANGULAR DIAPHRAGMS

(71) Applicant: Murata Manufacturing Co., Ltd., Nagaokakyo (JP)

(72) Inventors: Ventsislav Yantchev, Sofia (BG); Patrick Turner, San Bruno, CA (US); Viktor Plesski, Gorgier (CH); Julius Koskela, Helsinki (FI); Robert B. Hammond, Santa Barbara, CA (US)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 48 days.

This patent is subject to a terminal disclaimer.

(21) Appl. No.: 17/120,975

(22) Filed: Dec. 14, 2020

(65) Prior Publication Data

US 2021/0105002 A1 Apr. 8, 2021

Related U.S. Application Data

(63) Continuation of application No. 16/838,984, filed on Apr. 2, 2020, now Pat. No. 10,998,882, which is a (Continued)

(51) Int. Cl.
*H03H 9/56* (2006.01)
*H03H 3/02* (2006.01)
(Continued)

(52) U.S. Cl.
CPC ........ *H03H 9/568* (2013.01); *H03H 9/02015* (2013.01); *H03H 9/02031* (2013.01);
(Continued)

(58) Field of Classification Search
CPC ............... H03H 9/568; H03H 9/02015; H03H 9/02031; H03H 9/02062; H03H 9/02228;
(Continued)

(56) References Cited

U.S. PATENT DOCUMENTS 5,853,601 A 12/1998 Krishaswamy et al.
6,540,827 B1 4/2003 Levy et al.
(Continued)

FOREIGN PATENT DOCUMENTS

JP H10209804 A 8/1998
JP 2001244785 A 9/2001
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Rakesh B Patel
*Assistant Examiner* — Jorge L Salazar, Jr.
(74) *Attorney, Agent, or Firm* — ARENTFOX SCHIFF LLP

(57) ABSTRACT

Acoustic resonator devices, filter devices, and methods of fabrication are disclosed. An acoustic resonator includes a substrate having a surface and a single-crystal piezoelectric plate having front and back surfaces. The back surface is attached to the surface of the substrate except for a portion of the piezoelectric plate forming a diaphragm that spans a cavity in the substrate. An interdigital transducer (IDT) is formed on the front surface of the single-crystal piezoelectric plate such that interleaved fingers of the IDT are disposed on the diaphragm. The IDT is configured to excite a primary acoustic mode in the diaphragm in response to a radio frequency signal applied to the IDT. At least a portion
(Continued)

of an edge of the diaphragm is at an oblique angle to the fingers.

20 Claims, 13 Drawing Sheets

Related U.S. Application Data continuation-in-part of application No. 16/689,707, filed on Nov. 20, 2019, now Pat. No. 10,917,070, which is a continuation of application No. 16/230,443, filed on Dec. 21, 2018, now Pat. No. 10,491,192.

(60) Provisional application No. 62/874,709, filed on Jul. 16, 2019, provisional application No. 62/892,874, filed on Aug. 28, 2019, provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.
*H03H 9/02* (2006.01)
*H03H 9/13* (2006.01)
*H03H 9/17* (2006.01)
*H03H 9/60* (2006.01)
*H10N 30/87* (2023.01)

(52) U.S. Cl.
CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H03H 9/605* (2013.01); *H03H 3/02* (2013.01); *H03H 2003/023* (2013.01); *H03H 9/02039* (2013.01); *H10N 30/877* (2023.02)

(58) Field of Classification Search
CPC ........ H03H 9/132; H03H 9/174; H03H 9/176; H03H 9/562; H03H 9/564; H03H 9/605; H03H 3/02; H03H 9/02039; H03H 2003/023; H01L 41/0477
USPC .......................................... 333/133, 193–196
See application file for complete search history.

(56) References Cited

U.S. PATENT DOCUMENTS

| 6,707,229 | B1 | 3/2004 | Martin |
| 6,833,774 | B2 | 12/2004 | Abbott et al. |
| 6,932,686 | B1 | 8/2005 | Carruth et al. |
| 7,042,132 | B2 | 5/2006 | Bauer et al. |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,868,519 | B2 | 1/2011 | Umeda |
| 7,939,987 | B1 | 5/2011 | Solal et al. |
| 7,965,015 | B2 | 6/2011 | Tai et al. |
| 8,278,802 | B1 | 10/2012 | Lee et al. |
| 8,344,815 | B2 | 1/2013 | Yamanaka |
| 8,829,766 | B2 | 9/2014 | Milyutin et al. |
| 9,112,134 | B2 | 8/2015 | Takahashi |
| 9,130,145 | B2 | 9/2015 | Martin et al. |
| 9,219,466 | B2 | 12/2015 | Meltaus et al. |
| 9,240,768 | B2 | 1/2016 | Nishihara et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,564,873 | B2 | 2/2017 | Kadota et al. |
| 9,748,923 | B2 | 8/2017 | Kando et al. |
| 9,780,759 | B2 | 10/2017 | Kimura et al. |
| 10,200,013 | B2 | 2/2019 | Bower et al. |
| 10,389,391 | B2 | 8/2019 | Ito et al. |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,819,319 | B1 | 10/2020 | Hyde |
| 10,826,462 | B2 | 11/2020 | Plesski et al. |
| 10,868,510 | B2 | 12/2020 | Yantchev |
| 10,985,726 | B2 | 4/2021 | Plesski |
| 10,985,728 | B2 | 4/2021 | Plesski et al. |
| 10,998,882 | B2 * | 5/2021 | Yantchev ............... H03H 9/605 |
| 11,146,238 | B2 | 10/2021 | Hammond et al. |
| 11,201,601 | B2 | 12/2021 | Yantchev et al. |
| 11,323,089 | B2 | 5/2022 | Turner |
| 11,418,167 | B2 | 8/2022 | Garcia |
| 2002/0079986 | A1 | 6/2002 | Ruby et al. |
| 2002/0158714 | A1 | 10/2002 | Kaitila et al. |
| 2003/0199105 | A1 | 10/2003 | Kub et al. |
| 2004/0041496 | A1 | 3/2004 | Imai et al. |
| 2004/0207033 | A1 | 10/2004 | Koshido |
| 2004/0207485 | A1 | 10/2004 | Kawachi et al. |
| 2004/0261250 | A1 | 12/2004 | Kadota et al. |
| 2005/0099091 | A1 | 5/2005 | Mishima et al. |
| 2006/0131731 | A1 | 6/2006 | Sato |
| 2007/0090898 | A1 | 4/2007 | Kando |
| 2007/0188047 | A1 | 8/2007 | Tanaka |
| 2007/0194863 | A1 | 8/2007 | Shibata et al. |
| 2007/0296304 | A1 | 12/2007 | Fujii et al. |
| 2010/0064492 | A1 | 3/2010 | Tanaka |
| 2010/0102669 | A1 | 4/2010 | Yamanaka |
| 2010/0123367 | A1 | 5/2010 | Tai et al. |
| 2011/0109196 | A1 | 5/2011 | Goto |
| 2011/0199163 | A1 | 8/2011 | Yamanaka |
| 2011/0278993 | A1 | 11/2011 | Iwamoto |
| 2013/0207747 | A1 | 8/2013 | Nishii et al. |
| 2013/0234805 | A1 | 9/2013 | Takahashi |
| 2013/0271238 | A1 | 10/2013 | Onda et al. |
| 2013/0321100 | A1 | 12/2013 | Wang |
| 2014/0009032 | A1 | 1/2014 | Takahashi et al. |
| 2014/0113571 | A1 | 4/2014 | Fujiwara et al. |
| 2014/0145556 | A1 | 5/2014 | Kadota |
| 2014/0151151 | A1 | 6/2014 | Reinhardt |
| 2014/0152145 | A1 | 6/2014 | Kando et al. |
| 2014/0173862 | A1 | 6/2014 | Kando et al. |
| 2014/0225684 | A1 | 8/2014 | Kando et al. |
| 2014/0312994 | A1 | 10/2014 | Meltaus et al. |
| 2015/0014795 | A1 | 1/2015 | Franosch et al. |
| 2015/0244149 | A1 | 8/2015 | Van Someren |
| 2015/0319537 | A1 | 11/2015 | Perois et al. |
| 2015/0333730 | A1 | 11/2015 | Meltaus |
| 2016/0028367 | A1 | 1/2016 | Shealy |
| 2016/0049920 | A1 | 2/2016 | Kishino |
| 2016/0079958 | A1 | 3/2016 | Burak |
| 2016/0149554 | A1 | 5/2016 | Nakagawa |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0187352 | A1 | 6/2017 | Omura |
| 2017/0201232 | A1 | 7/2017 | Nakamura et al. |
| 2017/0214385 | A1 | 7/2017 | Bhattacharjee |
| 2017/0214387 | A1 | 7/2017 | Burak et al. |
| 2017/0222622 | A1 | 8/2017 | Solal et al. |
| 2017/0264266 | A1 | 9/2017 | Kishimoto |
| 2017/0290160 | A1 | 10/2017 | Takano et al. |
| 2017/0370791 | A1 | 12/2017 | Nakamura et al. |
| 2018/0013400 | A1 | 1/2018 | Ito et al. |
| 2018/0123016 | A1 | 5/2018 | Gong et al. |
| 2018/0152169 | A1 | 5/2018 | Goto et al. |
| 2018/0191322 | A1 | 7/2018 | Chang et al. |
| 2018/0212589 | A1 | 7/2018 | Meltaus et al. |
| 2018/0309426 | A1 | 10/2018 | Guenard et al. |
| 2018/0316333 | A1 | 11/2018 | Nakamura et al. |

(56) References Cited

U.S. PATENT DOCUMENTS

| | | |
|---|---|---|
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0131953 A1 | 5/2019 | Gong |
| 2019/0181833 A1 | 6/2019 | Nosaka |
| 2019/0207583 A1 | 7/2019 | Miura et al. |
| 2019/0273480 A1 | 9/2019 | Lin |
| 2019/0348966 A1 | 11/2019 | Campanella-Pineda et al. |
| 2020/0021272 A1 | 1/2020 | Segovia Fernandez et al. |
| 2020/0244247 A1 | 7/2020 | Maeda |
| 2020/0274520 A1 | 8/2020 | Shin et al. |
| 2020/0295729 A1 | 9/2020 | Yantchev |
| 2020/0304091 A1 | 9/2020 | Yantchev |
| 2021/0273631 A1 | 9/2021 | Jachowski et al. |
| 2021/0328575 A1 | 10/2021 | Hammond et al. |
| 2022/0103160 A1 | 3/2022 | Jachowski et al. |

FOREIGN PATENT DOCUMENTS

| | | |
|---|---|---|
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 200496677 A | 10/2005 |
| JP | 2006173557 A | 6/2006 |
| JP | 2007251910 A | 9/2007 |
| JP | 2010103803 A | 5/2010 |
| JP | 2010-233210 A | 10/2010 |
| JP | 2013-528996 A | 7/2013 |
| JP | 2013214954 A | 10/2013 |
| JP | 2015054986 A | 3/2015 |
| JP | 2016001923 A | 1/2016 |
| JP | 2018093487 A | 6/2018 |
| JP | 2019186655 A | 10/2019 |
| WO | 2010047114 A1 | 4/2010 |
| WO | 2016017104 | 2/2016 |
| WO | 2016052129 A1 | 4/2016 |
| WO | 2016147687 A1 | 9/2016 |
| WO | 2017188342 A1 | 11/2017 |
| WO | 2018003268 A1 | 1/2018 |
| WO | 2018003273 A1 | 1/2018 |
| WO | 2019138810 A1 | 7/2019 |
| WO | 2020092414 A2 | 5/2020 |
| WO | 2020100744 A1 | 5/2020 |

OTHER PUBLICATIONS

R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate Mems Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

Acoustic Properties of Solids ONDA Corporation 592 Weddell Drive, Sunnyvale, CA 94089, Apr. 11, 2003, pp. 5 (Year 2003).

Bahreynl, B. Fabrication and Design of Resonant Microdevices Andrew William, Inc. 2018, NY (Year 2008).

Material Properties of Tibtech Innovations, © 2018 TIBTECH Innovations (Year 2018).

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, Chiba, Japan (Year: 2018).

Abass et al., "Effects of inhomogeneous grain size distribution in polycrystalline silicon solar cells," Energy Procedia, 2011, vol. 10, pp. 55-60.

Chen et al., "Development and Application of SAW Filter," Micromachines, Apr. 2022, vol. 13, No. 656, pp. 1-15.

Gnewuch et al., "Broadband monolithic acousto-optic tunable filter," Optics Letters, Mar. 2000, vol. 25, No. 5, pp. 305-307.

Hermann et al., "Properties of shear-horizontal surface acoustic waves in different layered quartz-SiO2 structures," Ultrasonics, 1999, vol. 37, pp. 335-341.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, May 2015, vol. 62, No. 5, pp. 939-946.

Reinhardt et al., "Acoustic filters based on thin single crystal LiNbO3 films: status and prospects," IEEE International Ultrasonics Symposium, Sep. 2014, pp. 773-781.

\* cited by examiner

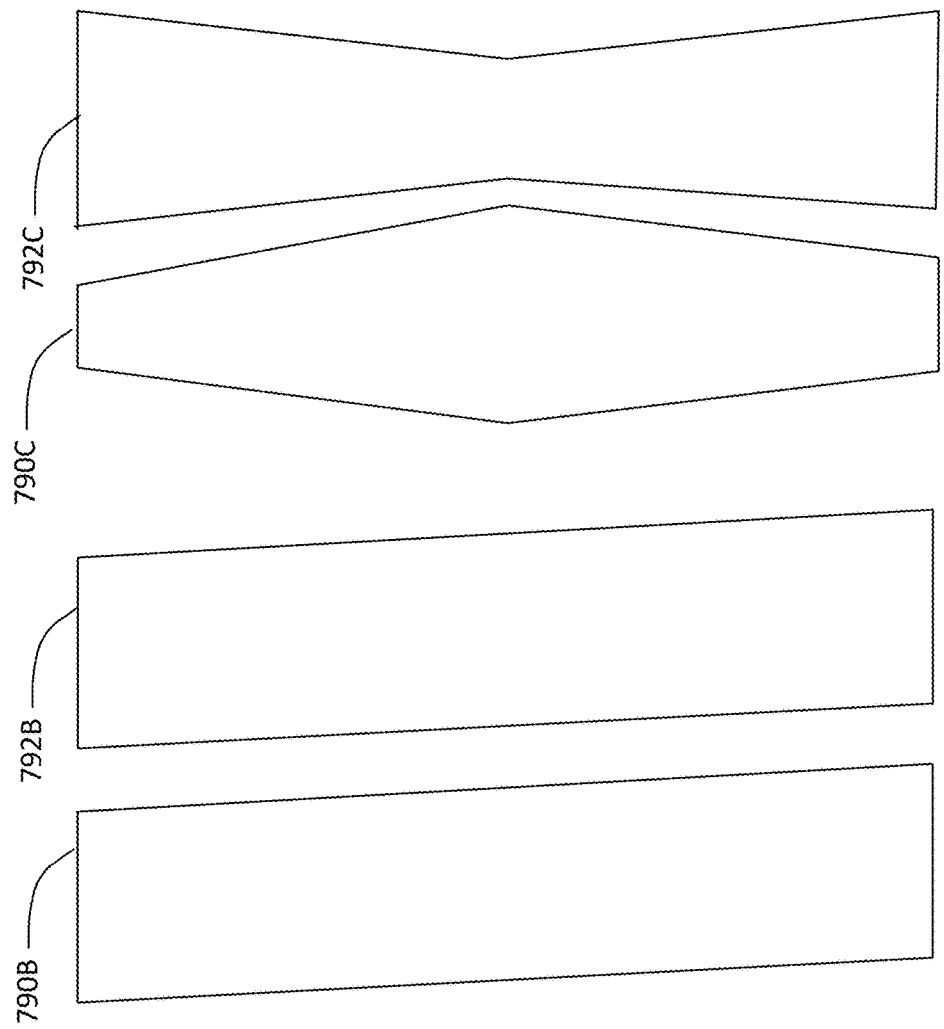
FIG. 7A  FIG. 7B  FIG. 7C

XBAR RESONATORS WITH NON-RECTANGULAR DIAPHRAGMS

RELATED APPLICATION INFORMATION

This patent is a continuation of application Ser. No. 16/838,984, entitled XBAR RESONATORS WITH NON-RECTANGULAR DIAPHRAGMS, filed Apr. 2, 2020, which claims priority from provisional patent applications 62/874,709, filed Jul. 16, 2019, entitled XBAR WITH SLANTED AND/OR PERFORATED MEMBRANE, and provisional patent application 62/892,874, filed Aug. 28, 2019, entitled XBAR RESONATORS WITH NON-RECTANGULAR CAVITIES, the entire content of each of which is incorporated herein by reference.

Application Ser. No. 16/838,984 is a continuation in part of application Ser. No. 16/689,707, entitled BANDPASS FILTER WITH FREQUENCY SEPARATION BETWEEN SHUNT AND SERIES RESONATORS SET BY DIELECTRIC LAYER THICKNESS, filed Nov. 20, 2019, which is a continuation of application Ser. No. 16/230,443, entitled TRANSVERSELY-EXCITED FILM BULK ACOUSTIC RESONATOR, filed Dec. 21, 2018, now U.S. Pat. No. 10,491,192, issued Nov. 26, 2019, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR, and application 62/753,815, filed Oct. 31, 2018, entitled LITHIUM TANTALATE SHEAR-MODE FILM BULK ACOUSTIC RESONATOR, the entire content of each of which is incorporated herein by reference.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 7A is a graphic illustrating asymmetric diaphragms with complementary shapes.

FIG. 7B is a graphic illustrating asymmetric diaphragms with other complementary shapes.

FIG. 7C is a graphic illustrating asymmetric diaphragms with other complementary shapes.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DESCRIPTION

Description of Apparatus

Figure 1:
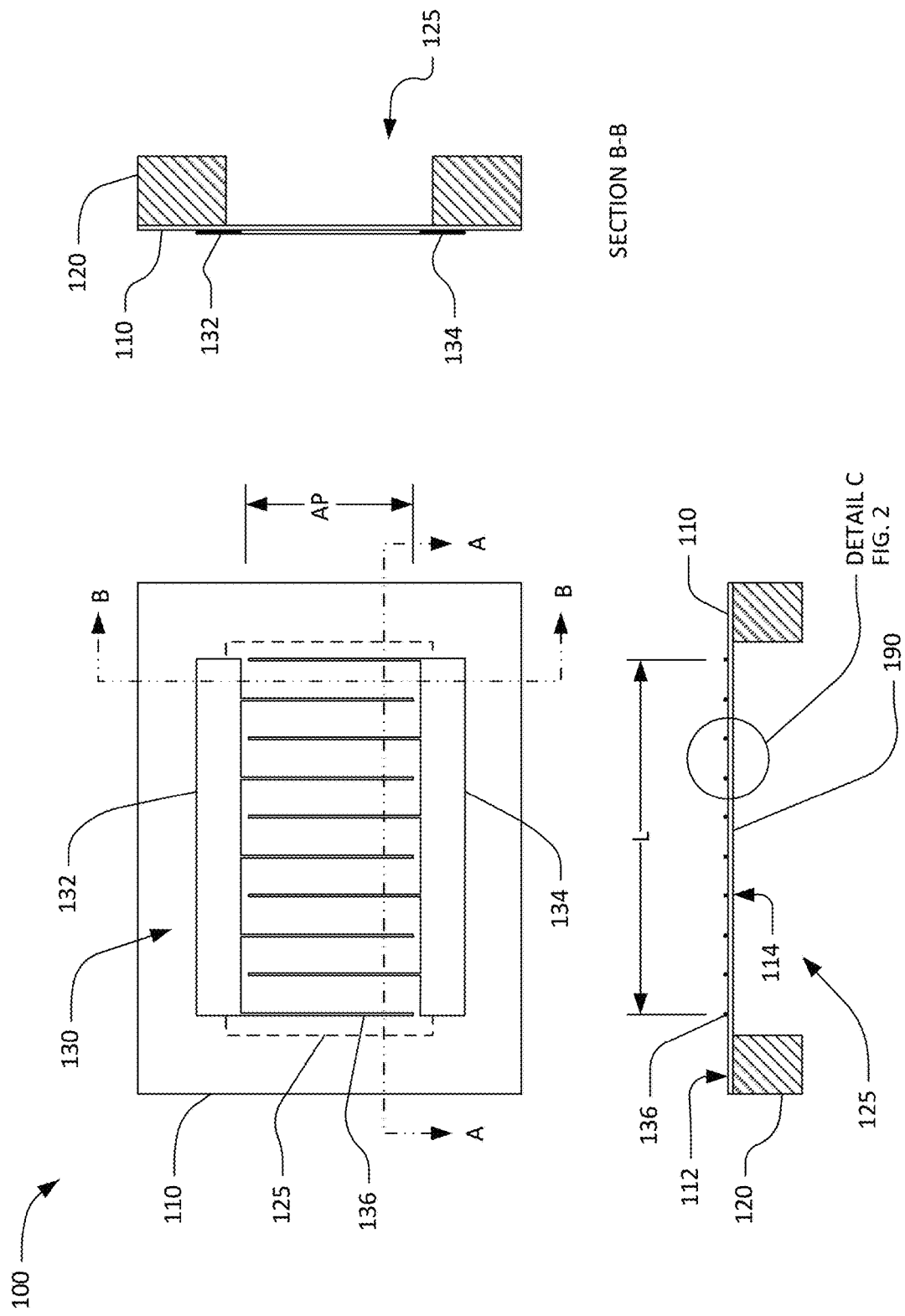
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. As will be discussed later in further detail, the piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 125 is formed in the substrate 120 such that the portion of the piezoelectric plate 110 containing the IDT 130 is suspended over the cavity 125 without contacting the substrate 120 to form a diaphragm 190. "Cavity" has its conventional meaning of "an empty space within a solid body." The cavity 125 may be a hole completely through the substrate 120 (as shown in Section A-A and Section B-B) or a recess in the substrate 120. The cavity 125 may be formed, for example, by selective etching of the substrate 120 before or after the piezoelectric plate 110 and the substrate 120 are attached. As shown in FIG. 1, the cavity 125 has a rectangular shape with an extent greater than the aperture AP and length L of the IDT 130. A shape of the cavity 125 defines a shape of the diaphragm 190. An edge of the diaphragm of an XBAR may have a different shape, such as a regular or irregular polygon. The edge of the diaphragm of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
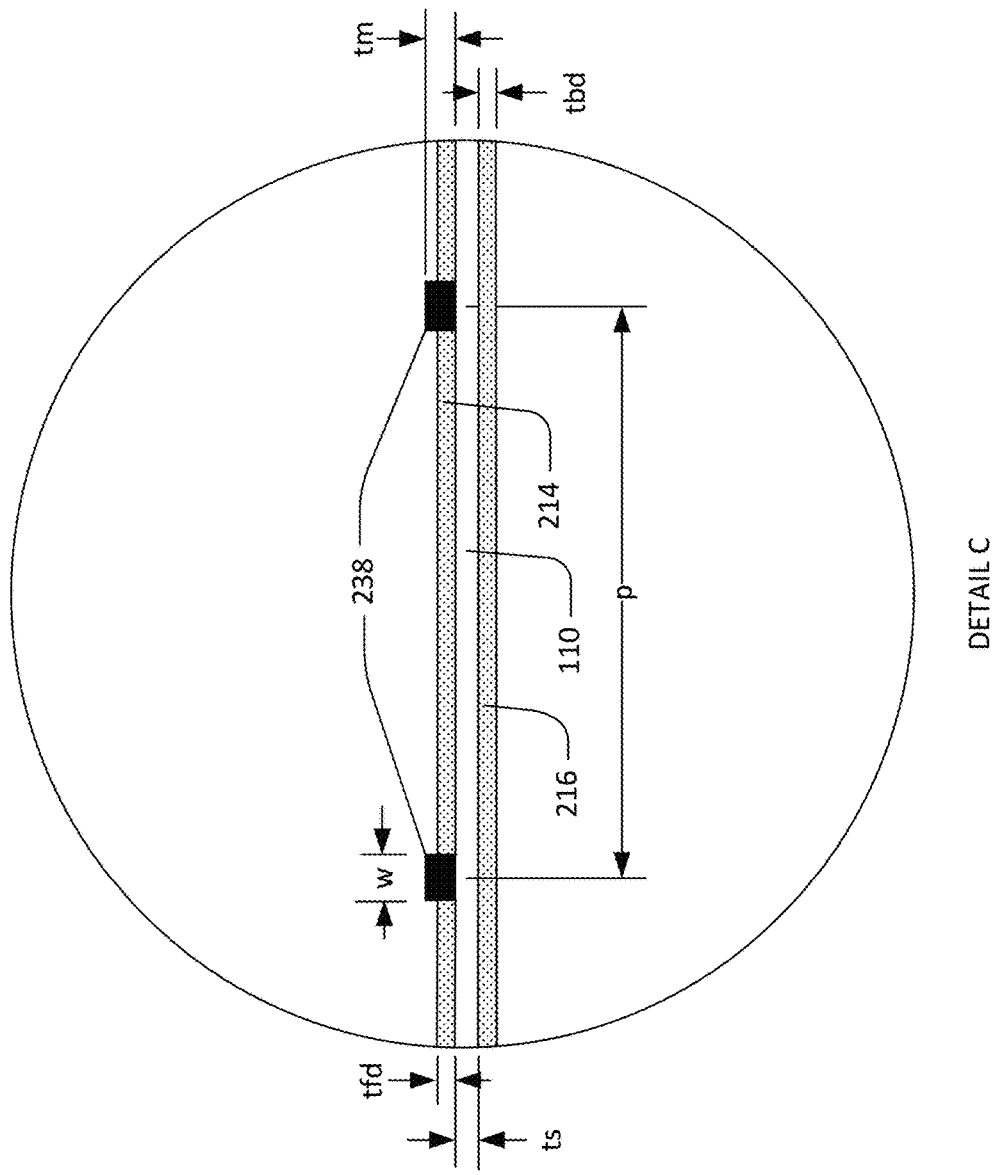
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness is of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum or a substantially aluminum alloy, copper or a substantially copper alloy, molybdenum, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
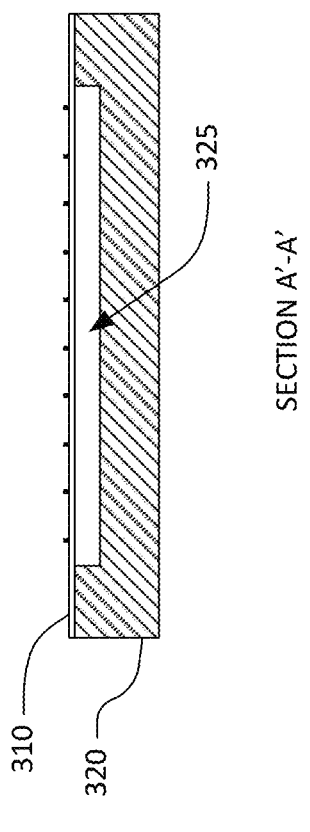
FIG. 3A is an alternative schematic cross-sectional view of the XBAR of FIG. 1.
Figure 3B:
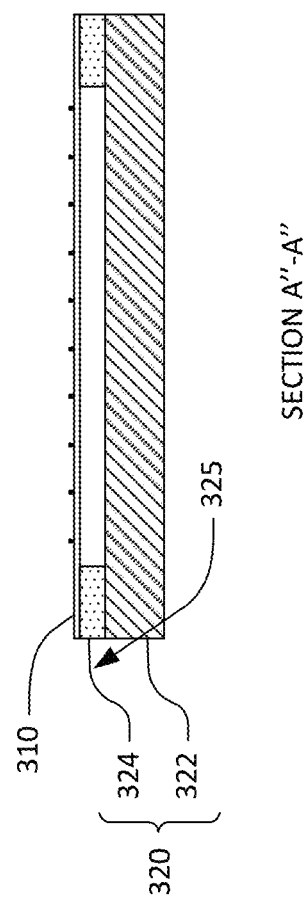
FIG. 3B is another alternative schematic cross-sectional view of the XBAR of FIG. 1.

FIG. 3A and FIG. 3B show two alternative cross-sectional views along the section plane A-A defined in FIG. 1. In FIG. 3A, a piezoelectric plate 310 is attached to a substrate 320. A cavity 325, which does not fully penetrate the substrate 320, is formed in the substrate under the portion of the piezoelectric plate 310 containing the IDT of an XBAR. The cavity 325 may be formed, for example, by etching the substrate 320 before attaching the piezoelectric plate 310. Alternatively, the cavity 325 may be formed by etching the substrate 320 with a selective etchant that reaches the substrate through one or more openings provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A cavity 325 is formed in the intermediate layer 324 under the portion of the piezoelectric plate 310 containing the IDT of an XBAR. The cavity 325 may be formed, for example, by etching the intermediate layer 324 before attaching the piezoelectric plate 310. Alternatively, the cavity 325 may be formed by etching the intermediate layer 324 with a selective etchant that reaches the substrate through one or more openings provided in the piezoelectric plate 310.

Figure 4:
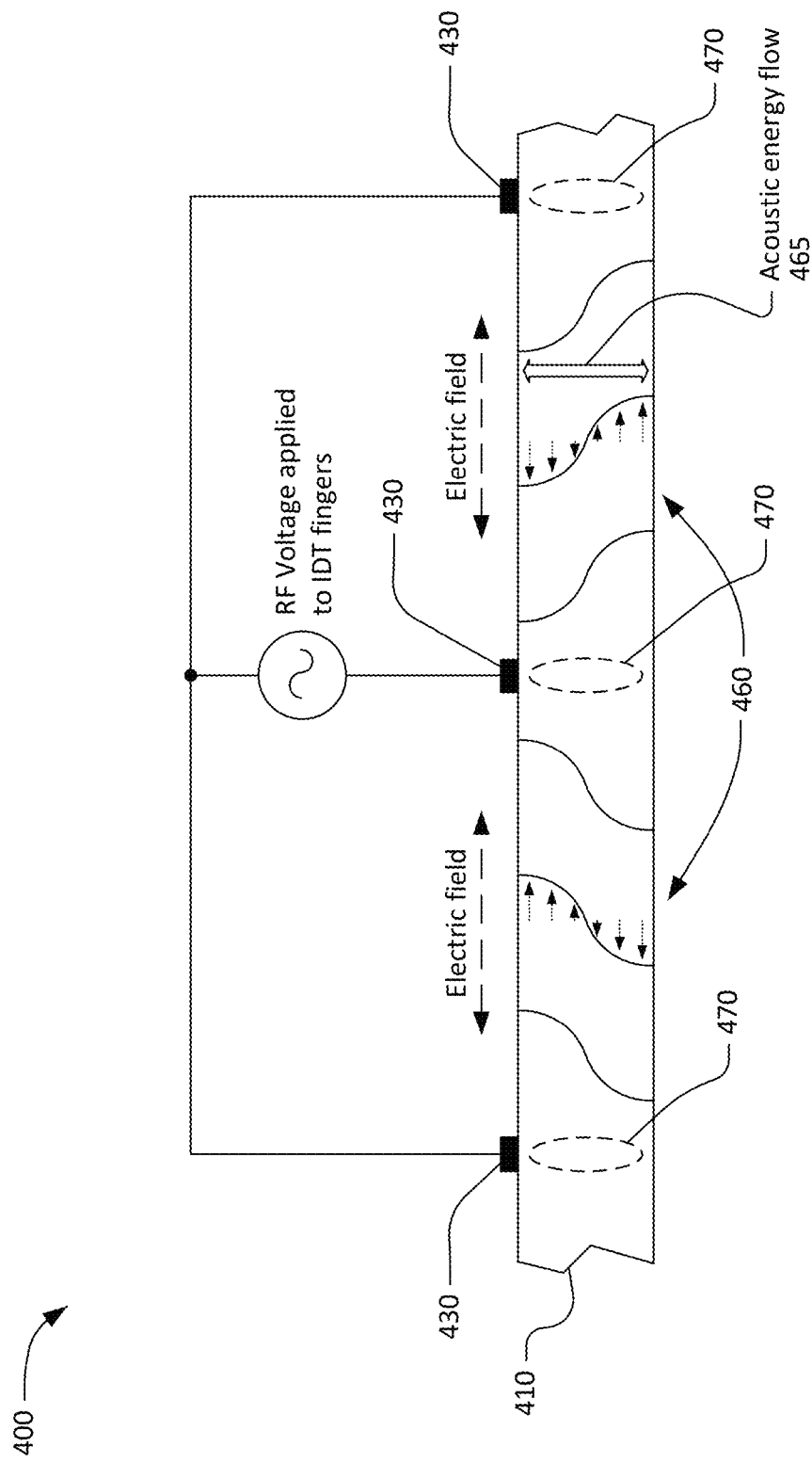
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited shear acoustic waves is substantially vertical, normal to the surface of the piezoelectric plate, as indicated by the arrow 465.

Considering FIG. 4, there is little electric field strength immediately under the IDT fingers 430, and thus acoustic modes are only minimally excited in the regions 470 under the fingers. There may be evanescent acoustic motions in these regions. An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
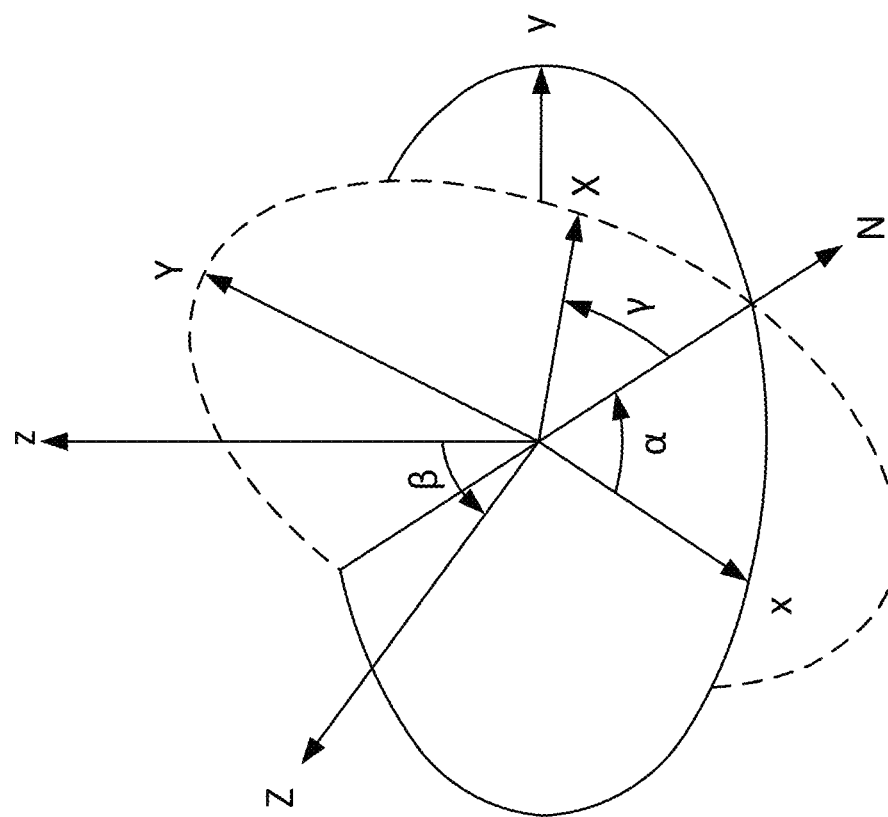
FIG. 5 is a graphical representation of Euler angles.

FIG. 5 is a graphical illustration of Euler angles. Euler angles are a system, introduced by Swiss mathematician Leonhard Euler, to define the orientation of a body with respect to a fixed coordinate system. The orientation is defined by three successive rotations about angles $\alpha$, $\beta$, and $\gamma$.

As applied to acoustic wave devices, XYZ is a three-dimensional coordinate system aligned with the crystalline axes of the piezoelectric material. xyz is a three-dimensional coordinate system aligned with the acoustic wave device, where the z axis is normal to the surface of the piezoelectric material and xy is the plane of the surface of the piezoelectric material. The vector N is the intersection of the xy and XY planes. The vector N is also the common perpendicular to the z and Z axis.

Although application Ser. No. 16/230,443 is not limited to a specific type or orientation of a piezoelectric material, all of the examples in those applications use Lithium Tantalate or Lithium Niobate piezoelectric plates with the Z crystalline axis normal to the plate surface and the Y crystalline axis orthogonal to the IDT fingers. Such piezoelectric plates have Euler angles of 0°, 0°, 90°. Related application Ser. No. 16/782,971 describes XBAR devices on piezoelectric plates with Euler angles 0°, $\beta$, 90°, where 0°≤$\beta$<60°. Such XBAR devices also have higher piezoelectric coupling than devices on piezoelectric plates with Euler angles of 0°, 0°, 90°. Related application Ser. No. 16/518,594 describes XBAR devices on piezoelectric plates with Euler angles 0°, $\beta$, 0°, where −15°≤$\beta$<0°. Such XBAR devices have higher piezoelectric coupling than devices on piezoelectric plates with Euler angles of 0°, 0°, 90°. In all of these XBAR configurations, one or both of crystalline X and Y axes lie in the plane of the surface, and the finger of the IDT are perpendicular to either the X or Y crystalline axis.

The IDT of an XBAR may excite other undesired, or spurious, acoustic modes that may include, but are not limited to, harmonics and higher orders of the primary acoustic mode, low-order Lamb modes, plate modes that propagate orthogonally to the IDT fingers, and higher order transverse waveguide modes that propagate oblique to the IDT fingers. XBARs can exhibit transverse modes with weak to moderate amplitude. The transverse modes are formed along the device aperture. These spurious acoustic modes may cause undesired perturbations or spurs in the admittance characteristics of an XBAR. When XBAR resonators are used in a filter, these transverse modes need to be suppressed to inhibit ripples in the passband of the filter. At least some spurious modes may be suppressed if the cavity and diaphragm of an XBAR has a non-rectangular shape and/or asymmetrical shape by breaking the symmetry in waveguiding modes and inhibiting resonant buildup of transversal modes. Some of the spurious modes may also be suppressed by slanting the IDT bus bars with respect the X and/or Y crystalline axis of the piezoelectric plate, and/or the IDT fingers.

Figure 6:
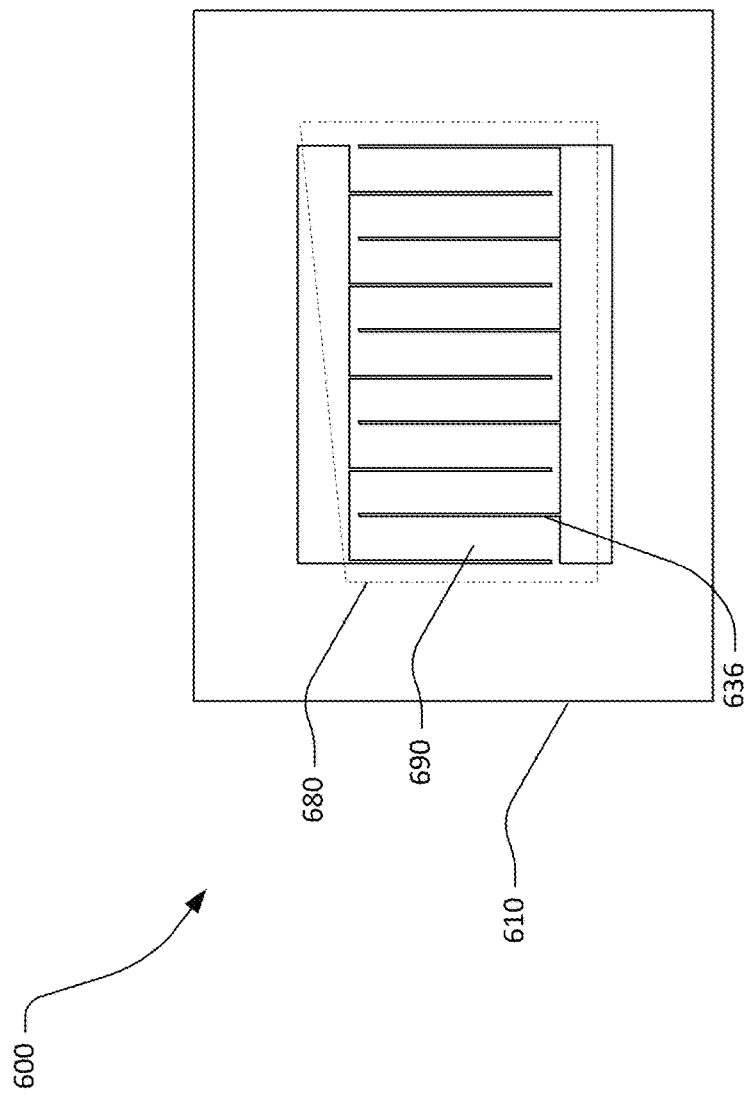
FIG. 6 is an alternative schematic plan view of an XBAR with an asymmetric diaphragm.

FIG. 6 is a schematic plan view of another XBAR 600. The XBAR 600 includes an IDT formed on a piezoelectric plate 610. The piezoelectric plate 610 is disposed over a cavity 680 in a substrate to form an asymmetric diaphragm 690 where at least one edge of the diaphragm is neither parallel nor perpendicular to the IDT fingers 636. In this example, the asymmetric diaphragm 690 has a non-rectangular shape. Specifically, the asymmetric diaphragm has four sides, and one side of the diaphragm 690 is at an oblique angle to at least one other side of the diaphragm and the IDT fingers, where oblique means neither normal nor parallel. However, the diaphragm can be any irregular polygon shape such that none of the edges of the cavity are parallel, nor are they parallel to the conductors of the IDT. A cavity may have a different shape with straight or curved edges.

A generally irregular form of the diaphragm causes destructive interference between waves reflected at diaphragm ends in a longitudinal direction (i.e., along the IDT). Thus, transverse waveguiding modes will have different lateral distributions along the IDT and will not constructively build up charge on the IDT, such that their electrical response will be suppressed.

FIGS. 7A, 7B, and 7C show configurations of diaphragms with complementary shapes. In FIG. 7A, diaphragm 790A, having a substantially similar shape to asymmetric diaphragm 690, and diaphragm 792A, being a rotation of the shape of diaphragm 790A, are arranged to be complementary to efficiently use space (i.e., reduce wasted space) on a piezoelectric plate having multiple XBARs while maintaining non-rectangular shapes. In FIG. 7B, diaphragms 790B and 792B have substantially similar shapes where opposite sides are substantially parallel and adjacent sides are at oblique angles (e.g., a non-rectangular parallelogram) and are arranged to be complementary. In FIG. 7C, diaphragms 790C and 792C, both composed of different configurations of four of the shapes of FIG. 7A, are also configured to have complementary shapes.

Figure 8B:
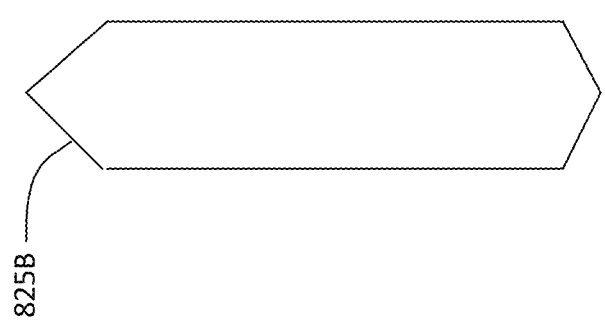
FIG. 8B is a graphic illustrating another diaphragm with an alternate shape.
Figure 8A:
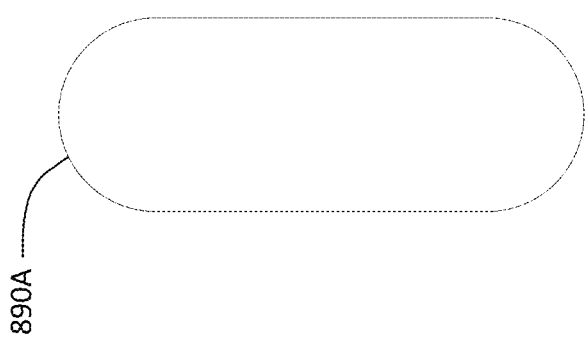
FIG. 8A is a graphic illustrating a diaphragm with an alternate shape.

FIG. 8A is a graphic illustrating an alternate diaphragm 890A having parallel opposite sides connected by smooth arcs. FIG. 8B is a graphic illustrating another alternate diaphragm 890B having an elongated hexagonal shape.

Figure 9:
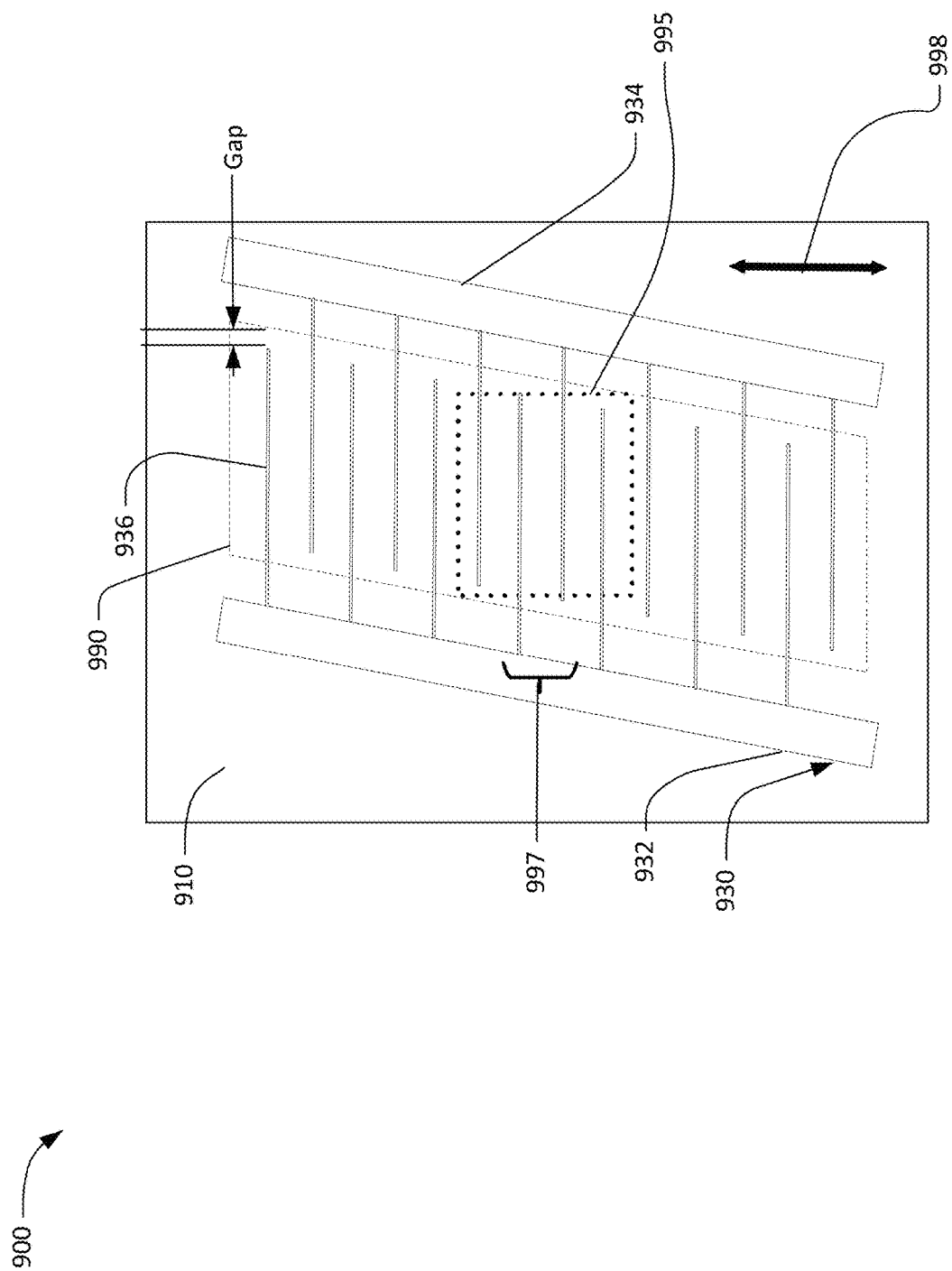
FIG. 9 is a schematic plan view of an XBAR showing a diaphragm with an asymmetric shape.

FIG. 9 is a schematic plan view of an exemplary XBAR 900 showing another non-rectangular parallelogram diaphragm 990, similar to that of FIG. 7B. Both the diaphragm 990 portion of the piezoelectric plate 910 and the IDT 930 are oblique or "slanted" having opposite sides parallel and adjacent sides oblique. The interleaved parallel fingers 936 of the IDT 930 extend from first and second busbars 932, 934, and an edge of the diaphragm 990, at an oblique angle.

For a rectangular diaphragm, the electric field excitation is along the length of the waveguide, as defined by the diaphragm. Propagating waves along the diaphragm exhibit transverse confinement (i.e., waveguiding) due to the wave reflections from the edges. Thus, propagating modes are likely to propagate parallel to the edges of the diaphragm and parallel to the busbars and couple to the IDT. However, for diaphragm 990, the electric field excitation is oblique to the waveguiding such that higher order waveguide modes (i.e., transversal modes), as well as lower order propagating Lamb modes, can have weaker coupling to the IDT 930, thus reducing spurious modes. The fundamental XBAR mode is a primarily bulk resonance mode with low group velocity in a longitudinal direction. Its limited propagation along the IDT is determined by the wave decaying upon multiple reflections between the diaphragm surfaces, while propagating along the IDT.

The effective lateral propagation is P>30(ts) (thickness of the diaphragm) around each IDT pair. The critical oblique angle θ=ArcTan(Gap/P_min), which is the angle between the edge of the diaphragm parallel to the bus bar 932 and a direction of propagation of electric field 998. The gap is the distance between the IDT tips and the oblique side of the diaphragm. In an example where ts=400 nm and gap=5 um, θ<25 Degrees. The effective confinement area 995 (P×Aperture) of the fundamental XBAR mode excited by the Nth IDT pair 997 is shown. Further, the electric field excitation is oblique to an X crystalline axis 998 of the piezoelectric plate, which also reduces spurious modes. In other examples, θ can be an angle in a range from 5 to 25 degrees, e.g., 20 degrees.

Figure 10:
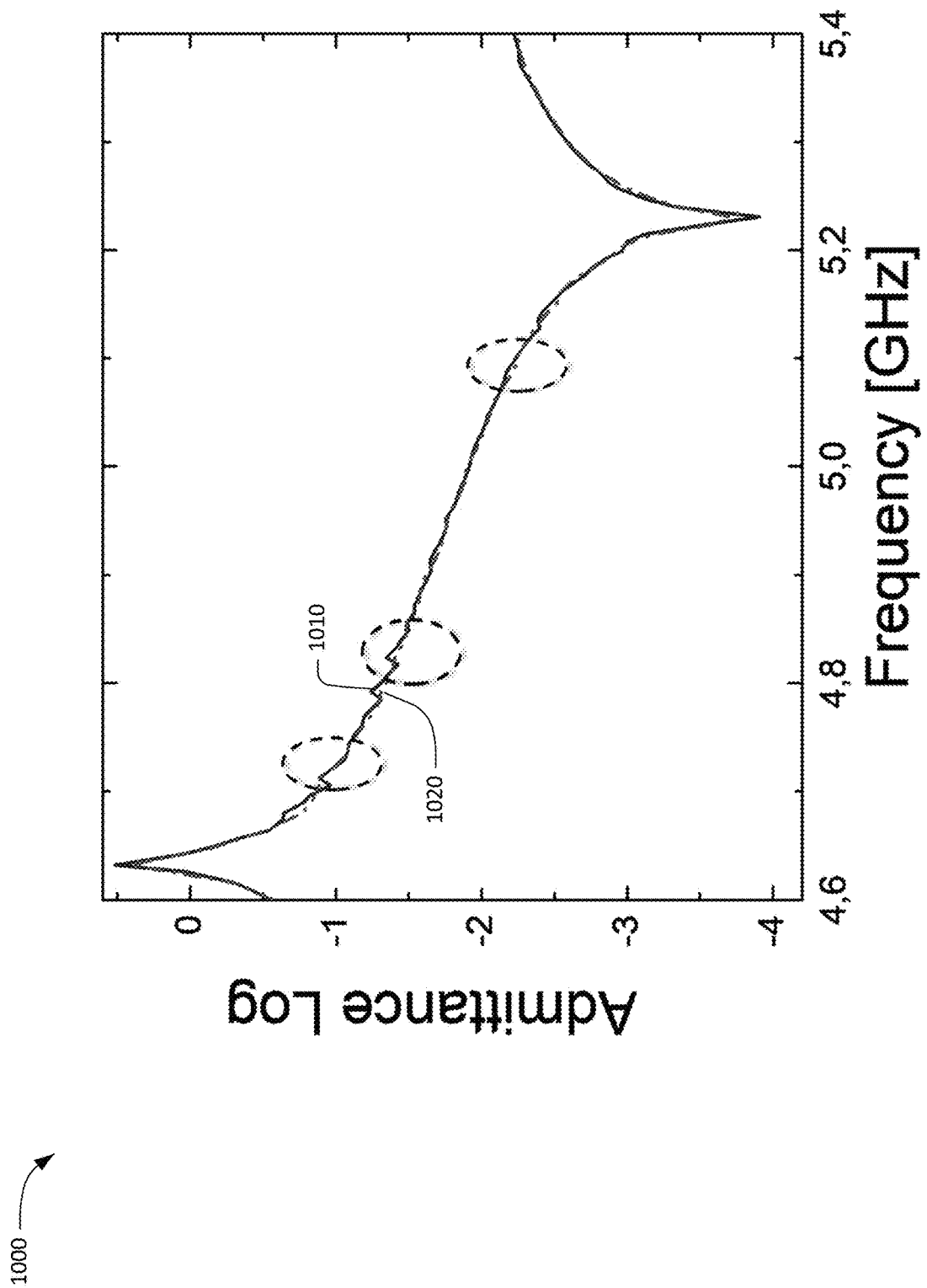
FIG. 10 is a chart comparing the admittances of simulated XBARs with and without asymmetric diaphragms.

FIG. 10 is a chart comparing the admittance log of simulated XBARs with and without asymmetric diaphragms. Solid curve 1010 is the admittance log of the XBAR with the symmetric diaphragm, similar to that shown in FIG. 1A. Dash-dot curve 1020 is the admittance log of the XBAR with the asymmetric diaphragm, similar to that shown in FIG. 9, where θ=10 degrees. As can be seen in FIG. 10 by comparing curve 1010 and curve 1020, the asymmetric diaphragm exhibits a smoother response. Specifically, in band ripples at about 4.7 GHz, 4.8 GHz and 5.1 GHz are suppressed.

Figure 11:
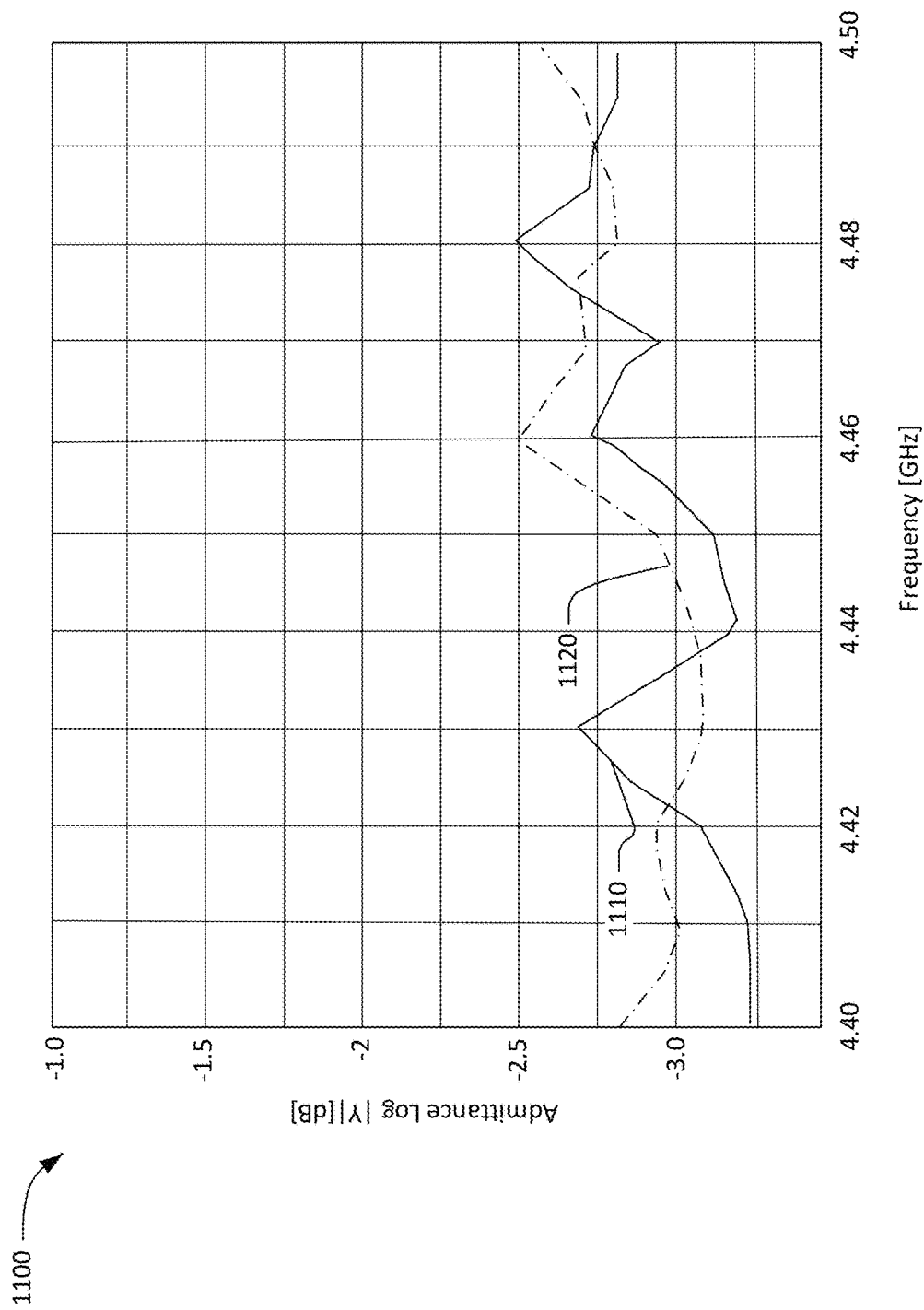
FIG. 11 is a chart comparing the admittances of simulated XBARs with and without other asymmetric diaphragms.

FIG. 11 is a chart comparing the admittance log of simulated XBARs with and without asymmetric diaphragms. The frequency range is below the XBAR main mode resonance. In this example, is =400 nm, tm=100 nm, aperture=40 microns, pitch=3.75 microns, and mark=1.05 microns. Solid curve 1110 is the admittance log of a symmetric diaphragm, similar to that shown in FIG. 1. Dash-dot curve 1120 is the admittance log of an asymmetric diaphragm similar to that of FIG. 9, where θ=10 degrees. In this example, two acute angles of the parallelogram are 80 degrees angles to each other and the other two obtuse angles of the parallelogram at 100 degree angles to each other. The spurs at 4.43 GHz and 4.48 Ghz appearing in the symmetric diaphragm curve 1110 are suppressed in the asymmetric diaphragm curve 1120.

Acoustic RF filters usually incorporate multiple acoustic resonators. Typically, these resonators have at least two different resonance frequencies. For example, an RF filter using the well-known "ladder" filter architecture includes shunt resonators and series resonators. A shunt resonator typically has a resonance frequency below the passband of the filter and an anti-resonance frequency within the passband. A series resonator typically has a resonance frequency within the pass band and an anti-resonance frequency above the passband. In many filters, each resonator has a unique resonance frequency. An ability to obtain different resonance frequencies for XBARs made on the same piezoelectric plate greatly simplifies the design and fabrication of RF filters using XBARs.

Figure 12:
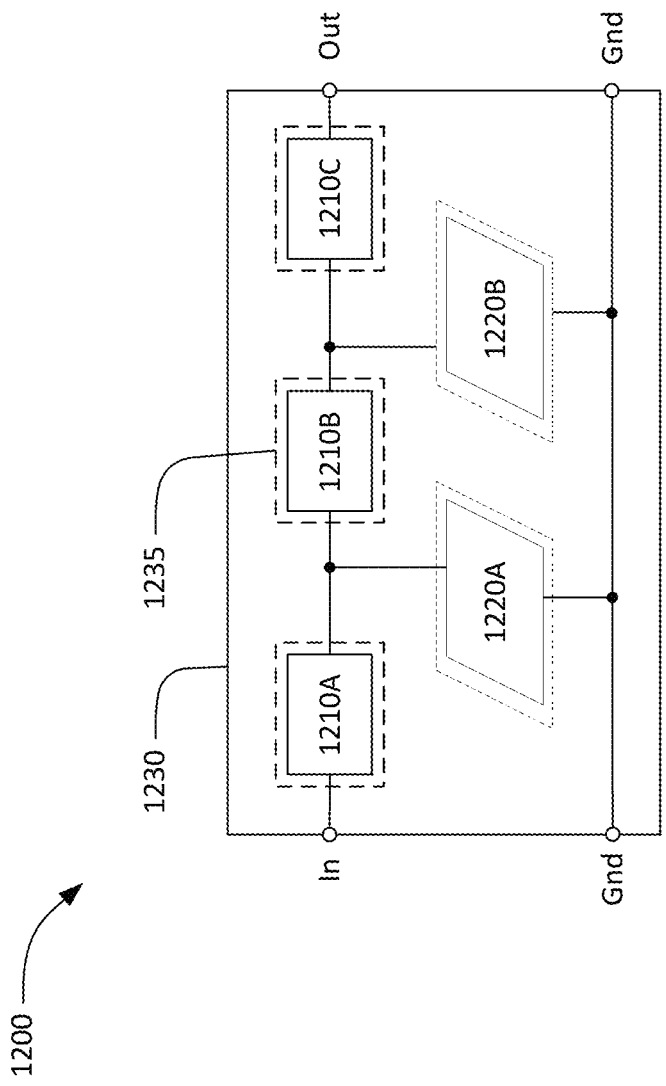
FIG. 12 is a schematic circuit diagram and layout of a filter using XBARs.

FIG. 12 is a schematic circuit diagram and layout for a high frequency band-pass filter 1200 using XBARs. The filter 1200 has a conventional ladder filter architecture including three series resonators 1210A, 1210B, 1210C and two shunt resonators 1220A, 1220B. The three series resonators 1210A, 1210B, and 1210C are connected in series between a first port and a second port. In FIG. 12, the first and second ports are labeled "In" and "Out", respectively. However, the filter 1200 is bidirectional and either port and serve as the input or output of the filter. The two shunt resonators 1220A, 1220B are connected from nodes between the series resonators to ground. All the shunt resonators and series resonators are XBARs. In the example of FIG. 12, the two shunt resonators 1220A, 1220B have asymmetric diaphragms, and the series resonators 1210A, 1210B, 1210C have symmetric diaphragms. One, some, or all of the resonators in a filter may have asymmetric diaphragms. The ability to select diaphragm shape independently gives the filter designer an additional degree of design freedom to minimize spurious effects.

The three series resonators 1210A, B, C and the two shunt resonators 1220A, B of the filter 1200 are formed on a single plate 1230 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 12, the cavities are illustrated schematically as the dashed rectangles (such as the rectangle 1235). In this example, each IDT is disposed over a respective cavity. In other filters, the IDTs of two or more resonators may be disposed over a single cavity.

Description of Methods

Figure 13:
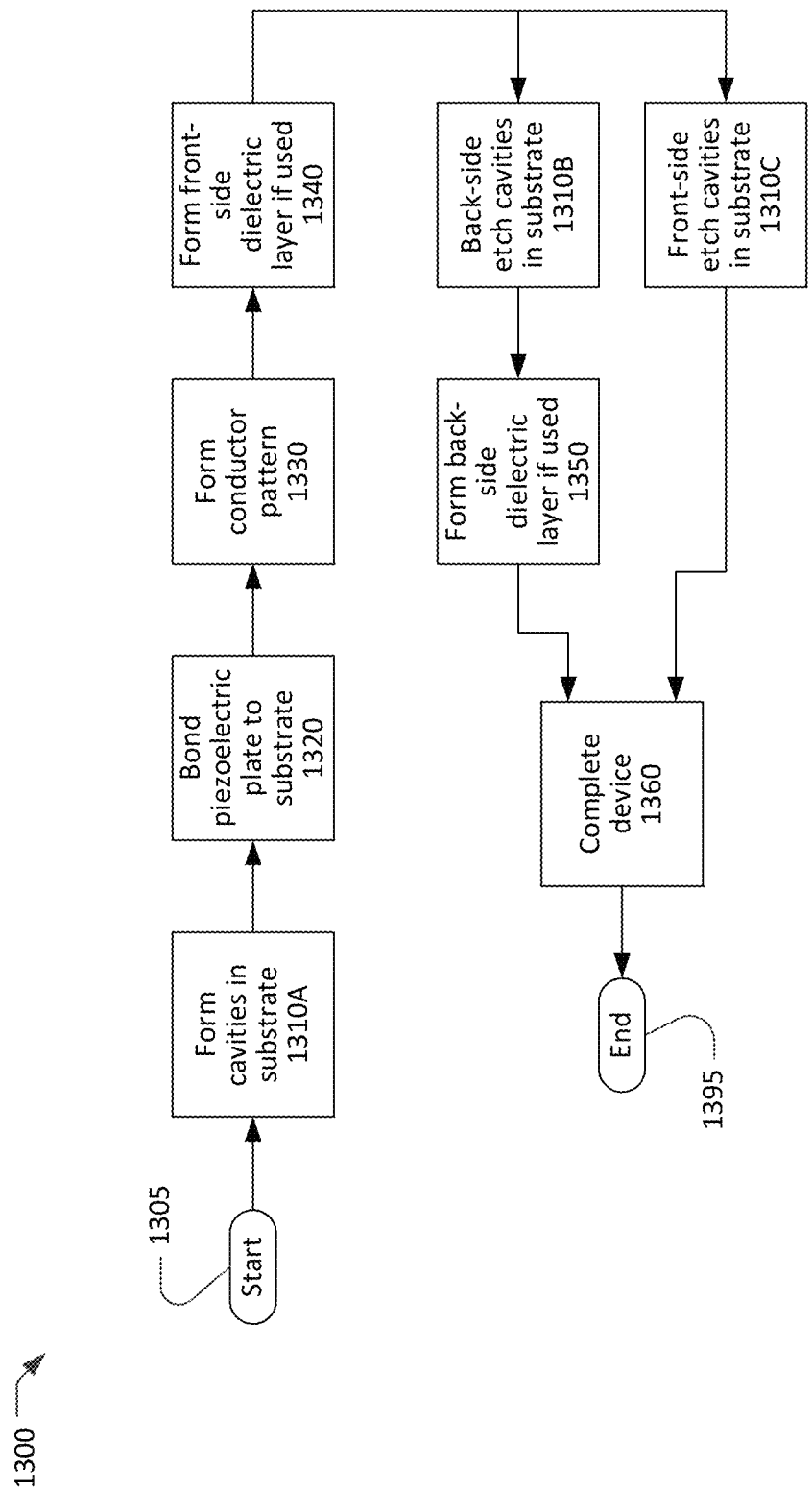
FIG. 13 is a flow chart of a process for fabricating an XBAR.

FIG. 13 is a simplified flow chart showing a process 1300 for making an XBAR or a filter incorporating XBARs. The process 1300 starts at 1305 with a substrate and a plate of piezoelectric material and ends at 1395 with a completed XBAR or filter. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

The flow chart of FIG. 13 captures three variations of the process 1300 for making an XBAR which differ in when and how cavities are formed in the substrate. The cavities may be formed at steps 1310A, 1310B, or 1310C. Only one of these steps is performed in each of the three variations of the process 1300.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 1300, one or more cavities are formed in the substrate at 1310A, before the piezoelectric plate is bonded to the substrate at 1320. A separate cavity may be formed for each resonator in a filter device. The one or more cavities may be formed using conventional photolithographic and etching techniques. Typically, the cavities formed at 1310A will not penetrate through the substrate, and the resulting resonator devices will have a cross-section as shown in FIG. 4A or FIG. 4B.

At 1320, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1330 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1330 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1330 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1340, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1300, one or more cavities are formed in the back side of the substrate at 1310B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In the second variation of the process 1300, a back-side dielectric layer may be formed at 1350. In the case where the cavities are formed at 1310B as holes through the substrate, the back-side dielectric layer may be deposited through the cavities using a convention deposition technique such as sputtering, evaporation, or chemical vapor deposition.

In a third variation of the process 1300, one or more cavities in the form of recesses in the substrate may be formed at 1310C by etching the substrate using an etchant introduced through openings in the piezoelectric plate. A separate cavity may be formed for each resonator in a filter device. The one or more cavities formed at 1310C will not penetrate through the substrate, and the resulting resonator devices will have a cross-section as shown in FIG. 3A or FIG. 3B.

In all variations of the process 1300, the filter device is completed at 1360. Actions that may occur at 1360 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1360 is to tune the resonant frequencies of the resonators within the device by adding or removing metal or dielectric material from the front side of the device. After the filter device is completed, the process ends at 1395.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a substrate having a surface;
    a single-crystal piezoelectric layer attached either directly or via one or more intermediate layers to the surface of the substrate, the single-crystal piezoelectric layer having a portion that forms a diaphragm over a cavity, the diaphragm having an edge at a portion of a perimeter of the cavity; and
    an interdigital transducer (IDT) at a surface of the single-crystal piezoelectric layer and having a pair of busbars that extend in a direction parallel to each other and a plurality of interleaved fingers that extend from each of the pair of busbars in a first direction and on the diaphragm,
    wherein the IDT is configured to excite a primary shear acoustic mode in the diaphragm in response to a radio frequency signal applied to the IDT, and
    wherein at least a portion of the edge of the diaphragm extends at an angle that is oblique to the first direction in which the interleaved fingers extend on the diaphragm.

2. The acoustic resonator of claim 1, wherein a direction of acoustic energy flow of the excited primary shear acoustic mode is substantially normal to front and back surfaces of the single-crystal piezoelectric layer.

3. The acoustic resonator of claim 2, wherein a Z-axis of the single-crystal piezoelectric layer is normal to the front and back surfaces.

4. The acoustic resonator device of claim 1, wherein the plurality of interleaved fingers are substantially parallel to each other and extend in the first direction, and an electric field generated by the plurality of interleaved fingers extends in a second direction normal to the first direction.

5. The acoustic resonator device of claim 4, wherein the at least a portion of the edge of the diaphragm extends at an angle in a range from 5 degrees to 25 degrees to the second direction.

6. The acoustic resonator device of claim 4, wherein the at least a portion of the edge of the diaphragm extends at an angle of 20 degrees to the second direction.

7. The acoustic resonator of claim 1, wherein the single-crystal piezoelectric layer comprises lithium niobate.

8. A method of fabricating a filter device on a piezoelectric layer attached either directly or via one or more intermediate layers to a substrate, the method comprising:
    forming one or more cavities in at least one of the substrate and the one or more intermediate layers, such that respective portions of the piezoelectric layer form one or more diaphragms suspended over the one or more cavities, each diaphragm having a respective edge a portion of a perimeter of a respective cavity; and
    forming a conductor pattern on a surface of the piezoelectric layer, the conductor pattern including a plurality of interdigital transducers (IDTs) of a respective plurality of resonators including a shunt resonator and a series resonator, wherein each IDT has a pair of busbars that extend in a direction parallel to each other and a plurality of interleaved fingers that extend from each of the pair of busbars in a first direction and on a respective diaphragm of the one or more diaphragms,
    wherein the piezoelectric layer and all of the plurality of IDTs are configured such that radio frequency signals applied to the IDTs excite respective primary shear acoustic modes in the respective diaphragms, and wherein at least a portion of the edge of at least one diaphragm extends at an oblique angle to the first direction in which the respective interleaved fingers extend on the respective diaphragm.

9. The method of claim 8, wherein the plurality of interleaved fingers disposed on the at least one diaphragm are substantially parallel to each other and extend in the first direction, and an electric field generated by said interleaved fingers extends in a second direction normal to the first direction.

10. The method of claim 9, wherein the at least a portion of the edge of the at least one diaphragm extends at an angle in a range from 5 degrees to 25 degrees to the second direction.

11. The method of claim 9, wherein the at least a portion of the edge of the at least one diaphragm extends at an angle of 20 degrees to the second direction.

12. The method of claim 8, further comprising forming the piezoelectric layer of lithium niobate.

13. The method of claim 8, wherein a Z-axis of the piezoelectric layer is normal to front and back surfaces of the piezoelectric layer.

14. The method of claim 8, wherein a direction of acoustic energy flow of the excited primary shear acoustic modes is substantially normal to front and back surfaces of the piezoelectric layer.

15. A filter device comprising:
a substrate having a surface;
at least one single-crystal piezoelectric layer attached either directly or via one or more intermediate layers to the surface of the substrate, the at least one single-crystal piezoelectric layer having portions that form one or more diaphragms over respective cavities, each diaphragm having a respective edge at a portion of a perimeter of a respective cavity; and
a conductor pattern at a surface of the at least one single-crystal piezoelectric layer, the conductor pattern including a plurality of interdigital transducers (IDTs) of a respective plurality of acoustic resonators, wherein each IDT has a pair of busbars that extend in a direction parallel to each other and a plurality of interleaved fingers that extend from each of the pair of busbars in a first direction and on a diaphragm of the one or more diaphragms, wherein the at least one single-crystal piezoelectric layer and all of the IDTs are configured such that respective radio frequency signals applied to each IDT excite respective primary shear acoustic modes in the respective diaphragms, wherein at least a portion of the edge of at least one diaphragm extends at an angle that is oblique to the first direction in which the respective interleaved fingers extend on the respective diaphragm.

16. The filter device of claim 15, wherein a Z-axis of the at least one single-crystal piezoelectric layer is normal to front and back surfaces of the at least one single-crystal piezoelectric layer.

17. The filter device of claim 15, wherein the plurality of interleaved fingers disposed on the at least one diaphragm are substantially parallel to each other and extend in first direction, and an electric field generated by said the plurality of interleaved fingers extends in a second direction normal to the first direction.

18. The filter device of claim 17, wherein the at least a portion of the edge of the at least one diaphragm extends at an angle in a range from 5 degrees to 25 degrees to the second direction.

19. The filter device of claim 17, wherein the at least a portion of the edge of the at least one diaphragm extends at an angle of 20 degrees to the second direction.

20. The filter device of claim 17, wherein the at least one single-crystal piezoelectric layer comprises lithium niobate.

* * * * *